United States Patent [19]

Proebsting

[11] Patent Number: 5,274,593
[45] Date of Patent: Dec. 28, 1993

[54] HIGH SPEED REDUNDANT ROWS AND COLUMNS FOR SEMICONDUCTOR MEMORIES

[75] Inventor: Robert J. Proebsting, Los Altos, Calif.

[73] Assignee: Intergraph Corporation, Huntsville, Ala.

[21] Appl. No.: 590,243

[22] Filed: Sep. 28, 1990

[51] Int. Cl.$^5$ ............................................. G11C 7/00
[52] U.S. Cl. ............................. 365/200; 365/225.7; 371/11.1
[58] Field of Search ............................ 365/200, 225.7; 371/10.3, 11.1

[56] References Cited

U.S. PATENT DOCUMENTS 5,134,584 7/1992 Boler et al. ..................... 365/200

Primary Examiner—Joseph A. Popek
Attorney, Agent, or Firm—Townsend and Townsend Khourie and Crew

[57] ABSTRACT

A semiconductor memory having a redundant column is described in which access time is not reduced when the redundant column is employed to replace a defective column. The memory includes a number of columns of memory cells, each column having a corresponding input/output node. A set of input/output lines, the set typically being one smaller than the number of columns, is connected to a corresponding set of switches. The switches connect each input/output line to one, and only one input/output node chosen in response to a control signal supplied to the switch. By having positioned all of the switches on the left side of the defective column to connect to columns to the left of their respective input/output connections, and by positioning all of the switches on the right side of the defective column to connect to the columns on the right side of their respective input/output connections, the defective column is removed from operation without increase in propagation delays. In this manner, the access speed of the memory remains constant regardless of which column is defective.

9 Claims, 1 Drawing Sheet

HIGH SPEED REDUNDANT ROWS AND COLUMNS FOR SEMICONDUCTOR MEMORIES

BACKGROUND OF THE INVENTION

1. Field of the Invention

This invention relates to semiconductor memories, and in particular to semiconductor memories having redundant columns which are as fast as the other columns in the semiconductor memory.

2. Description of the Prior Art

Numerous types of semiconductor read/write memories such as SRAMs, DRAMs, PROMs, EPROMs, EEPROMs, etc., are well known and commercially available. Such memories are typically arranged as rows and columns of memory cells, each cell within which is capable of storing a single bit of information—a zero or a one.

With advances in integrated circuit fabrication technology, the number of memory cells which may be placed on a single chip is increasing rapidly. These advances result from two factors—the capability of integrated circuit manufacturers to manufacture reliably larger chips, and the shrinking size of memory cells enabling more cells to be placed in a given area.

To further enhance the yield of integrated circuit chips containing memory cells, redundant rows and columns of memory cells have been developed, and are now well known. (To simplify the following explanation, the term "columns" is used rather than "rows or columns." It will be appreciated that either or both rows or columns may be employed, even though only columns are mentioned.) In a typical memory having redundant columns, extra columns are included on the chip with the regular columns; however, the spare columns are fusibly or otherwise selectively connectible in place of defective columns. In typical prior art systems, fuses are used to disconnect a defective column and other fuses to electrically replace the defective column with the spare column, program the address decoder of the redundant column, and perform any other necessary changes.

Although such prior art systems function satisfactorily in the sense that it is transparent to the system in which the memory is employed whether the information accessed is stored in a regular column or in a spare column, the use of spare columns carries with it several disadvantages. The primary disadvantage of spare columns is access speed.

The spare columns typically are slower than regular columns because of signal propagation delays. Because the spare columns are located to one side or the other of the memory array, all of the regular columns in the memory array will have a relatively short path length connection to an output node, while the spare columns will have a longer path to get the output data from the physical location of the redundant column output to its required destination at the output of the defective column. The longer path delays signal transmission between the spare columns and the exterior of the chip as compared to the regular columns. Because the access time of a memory must take into account the time required to obtain data from the slowest column, these delays result in slower access time for circuits in which the spare columns are employed, as compared to circuits in which they are not. The premium placed on high speed operation of memories makes this a substantial disadvantage.

SUMMARY OF THE INVENTION

This invention provides a memory system in which redundant columns may be employed without diminishing the speed of operation of the overall integrated circuit in which they are employed. The spare columns employed according to a preferred embodiment of this invention do not have increased propagation delay, and therefore access time, as compared to the regular columns. The avoidance of extra propagation delay for the spare columns is made possible by a unique switching system in which every column input/output node is selectably connectible by a short path length connection to more than one input/output line in the array. By not connecting a defective column to any input/output line, memories only use good columns and will operate at the same speed whether or not any defective, but unused, columns exist.

In a preferred embodiment a semiconductor memory having redundant columns fabricated according to this invention includes a first plurality of columns of memory cells, each column having at least one corresponding input/output node; and a second plurality of input/output lines, the second plurality being less than the first plurality, each input/output line having a corresponding connection node. A third plurality of switches has each switch connected to a corresponding connection node of the second plurality of input/output lines. Each switch is selectively connectible to one of at least two of the input/output nodes of adjoining columns of memory cells.

DETAILED DESCRIPTION OF THE PREFERRED EMBODIMENTS

Figure 1:
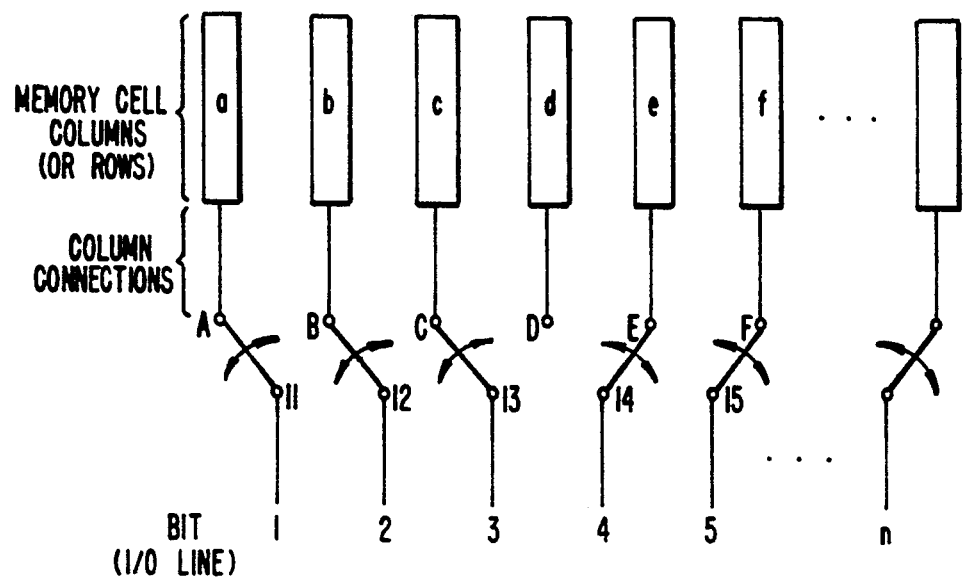
FIG. 1 is a block diagram illustrating the operating principle of the invention.

FIG. 1 is a block diagram which illustrates the operating principle of the invention. Shown in FIG. 1 are columns of memory cells arbitrarily designated a, b, c, d, . . . . Each column of memory cells is intended to represent a series of cells connected along a single column. Typically, the column length will be a number of cells which is a power of two, for example, 256. Each of the cells is connected in a well known manner, so that when suitable addressing information is supplied on a row connected to the particular cell, the data supplied through the column can be written onto the memory cell or the contents of the cell can be detected and read out through the column connections. For this reason lines 1, 2, 3, . . . n are referred to herein as input/output lines. Of course, in other embodiments of the invention where redundant rows are employed in place of defective rows, the columns shown in FIG. 1 may be considered to be rows.

Each of the columns (or rows) has an input/output connection A, B, C, D, . . . , as illustrated. Ultimately, the columns are to be connected to input/output lines 1, 2, 3, 4, . . . , also as shown. Each of the input/output lines has associated with it a corresponding switch. For example, input/output line 1 has connected to it a switch 11. Input/output line 2 has a switch 12 connected to it. Input/output line 3 includes a switch 13. As shown the switches allow an input/output line to be connected to either one of two columns of memory cells.

To understand the function of the switches in replacing a defective column of memory cells with a redundant functional column, assume that column d is defective. Column d can be switched out of operation, and a functional column switched in its place, by appropriate positioning of the switches. To achieve this, switch 11 is positioned to connect line 1 to node A. Switch 12 is employed to connect line 2 to node B. Switch 13 connects line 3 to node C. Now, instead of connecting line 4 to node D, switch 14 is used to connect line 4 to node E. Similarly, switch 15 is used to connect line 5 to node F. As will be appreciated, by having positioned all of the switches on the left side of the defective column to connect to columns to the left of their respective input/output connections, and by positioning all of the switches on the right side of the defective column to connect to the columns on the right side of their respective input/output connections, the defective column is removed from operation without increase in propagation delays. In particular, the signal path length between each of the input/output lines 1, 2, 3, 4, and 5 and the corresponding column connections A, B, C, E, and F is of equal length and therefore equal delay.

The preceding discussion assumes that for each column of memory cells only a single input/output line is required. For embodiments of the invention applicable to memories employing complementary input/output lines, such as the complementary bit lines in conventional DRAMs and SRAMs, each of the nodes A, B, . . ., represent a pair of column connections, while each switch 11, 12, . . . , represents a pair of switches, and each line 1, 2, . . . , represents a pair of lines. For such an embodiment the connections among the switches, input/output lines and nodes are discussed below.

Figure 2:
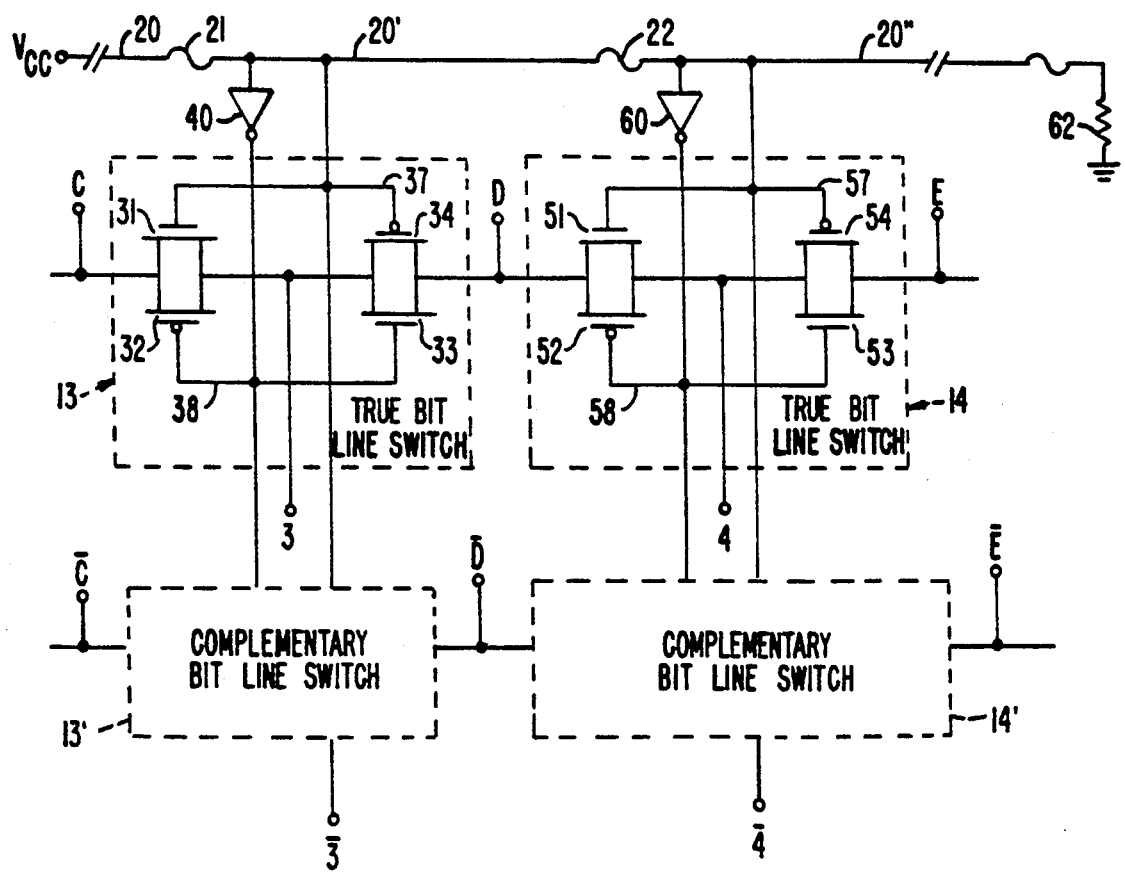
FIG. 2 is a circuit schematic illustrating a detailed embodiment of the invention.

A preferred embodiment for the circuitry for implementing the switches 11, 12, . . . with CMOS technology is shown in FIG. 2. The circuitry depicted there illustrates the implementation of the switches for both single bit line and complementary bit line embodiments. The single bit line embodiment uses only one single-pole, double-throw switch per input/output bit, e.g., switch 13 for input/output line 3 and switch 14 for input/output line 4. For the complementary bit line embodiment both the true and complementary switches are used, i.e., switch 13 is used for line 3 and switch 13' is used for line $\overline{3}$. Switch 13 can be set to connect input/output bit 3 to either column C or to column D and is set to connect input/output line 3 to column connection C, while switch 14 is set to connect input/output line 4 to column E.

The circuitry shown in FIG. 2 is connected to a potential source Vcc, typically +5 volts, which is applied to line 20. Line 20 also includes a series of fuses 21, 22, with one fuse being disposed between each pair of switches as shown. For example, fuse 22 separates switch pair 13, 13' from switch pair 14, 14'.

Each switch includes two pairs of complementary MOS transistors. PMOS transistors are designated by a small circle on their gates. For example, switch 13 includes an NMOS transistor 31, a PMOS transistor 32, a second NMOS transistor 33, and a second PMOS transistor 34. Each of the complementary pairs of transistors has correspondingly connected sources and drains as shown. That is, transistors 31 and 32 have their sources coupled together, and their drains coupled together, as do transistors 33 and 34. In addition, line 37 connects the gate of transistor 31 to the gate of transistor 34, while line 38 connects the gate of transistor 32 to the gate of transistor 33. Line 37 is connected directly to node 20', while line 38 is connected to the output of inverter 40 whose input is node 20'.

Switch 14 is similar in structure to switch 13. Switch 14 also includes two pairs of transistors configured to connect input/output line 4 to one of nodes D or E. Node 57 in switch 14 corresponds to node 37 in switch 13, while node 58 in switch 14 corresponds to node 38 in switch 13.

The state of the switches 13 and 14 is controlled by fuses in the line 20. Because fuse 21 and all fuses (not shown) to the left of fuse 21 have not been blown, line 37 will be connected directly to the positive voltage Vcc holding NMOS transistor 31 on and PMOS transistor 34 off. Inverter 40 will cause an opposite condition on line 38, turning on PMOS transistor 32 and turning off NMOS transistor 33. Hence, both transistors 31 and 32 will be on, while both transistors 33 and 34 will be off. The on condition of both transistors 31 and 32 connects column connection C to input/output line 3. Similarly, the off condition of both transistors 33 and 34 disconnects input/output line 3 from column connection D. As a result, input/output line 3 is connected only to column connection C. In a corresponding manner, all of the switches (not shown) to the left of switch 13 will be switched to the left (as shown in FIG. 1).

A resistor 62 is connected between the right side of line 20 and ground. Its purpose is to bring all nodes 20, 20', 20'', etc., to the right of any single blown fuse element to ground rather than to Vcc. All of the switches to the right of fuse 22 are thrown to the right by virtue of the blowing of fuse 22. Fuse 22 will be blown at the time the memory circuit is tested, and may be blown using any well known technique. In a preferred embodiment, a laser is employed. Opening fuse 22 allows resistor 62 to bring those portions of line 20 to the right of the blown fuse element 22 to ground. The low level on line 20'' is directly connected to line 57, thereby turning off NMOS transistor 51 and turning on PMOS transistor 54. Inverter 60 supplies a high potential to line 58, thereby turning off PMOS transistor 52 and turning on NMOS transistor 53. The on condition of both transistors 53 and 54 connects input/output line 4 to column connection E. Correspondingly, the off condition of transistors 51 and 52 disconnects column connection D from input/output line 4. Because each of transistors 33, 34, 51 and 52 is off, node D is isolated, and defective memory cell column D is disconnected from all input/output lines.

At the bottom of FIG. 2, an additional pair of switches 13' and 14' are depicted. These switches are added for semiconductor read/write memories employing complementary input/output lines, for example, most SRAMs and DRAMs. Each of the complementary input/output line switches 13' and 14' is identical, with respect to its internal circuitry, to the corresponding switches 13 and 14. Each complementary bit line switch 13', 14' is also connected to line 20. In the manner depicted, however, instead of being connected to the true column connections C, D, and E, the complementary bit line switches are connected to nodes $\overline{C}$, $\overline{D}$ and $\overline{E}$. The complementary switches provide complementary input/output nodes $\overline{3}$ and $\overline{4}$ in the same manner as the true input/output line switches provide input/output nodes 3 and 4.

Although a preferred embodiment of the invention has been described above with respect to specific circuitry, it should be understood that the invention is not so limited. Other circuits may be readily employed to carry out the invention using different switching arrangements. For example, bipolar switches may be employed. In addition, while fuses have been described as a preferred embodiment for turning off and on the various switches, it should be appreciated that any technique may be employed for connecting and disconnecting the line as necessary, for example, PROM or EPROM cells.

I claim:

1. A semiconductor memory comprising:

a plurality of columns of memory cells, each column having a corresponding input/output node means coupled to the column;

a plurality of input/output line means the plurality of columns being less than the plurality of input/output line means, each input/output line means having corresponding connection node means;

a plurality of switch means, the plurality of switch means being of the same number as the plurality of input/output line means, each switch means being connected to a corresponding connection node means of the plurality of input/output line means, and being selectively connectible to one of at least two of the input/output node means of adjoining columns of memory cells, each switch means including a first pair of complementary field effect transistors connected together to connect or disconnect a selected input/output line from the input/output node of a first adjoining column of memory cells; and a second pair of complementary field effect transistors connected together to connect or disconnect the selected input/output line from the input/output node of a second adjoining column of memory cells.

2. A memory as in claim 1 wherein:

each input/output node means comprises one node;

each input/output line means comprises one input/output line;

each connection node means comprises one connection node; and each switch means comprises one multiple position switch.

3. A memory as in claim 2 wherein each switch means is selectively connectible to one of two of the input/output nodes.

4. A memory as in claim 1 wherein:

the first pair of complementary field effect transistors includes a first PMOS transistor and a first NMOS transistor;

the second pair of complementary field effect transistors includes a second PMOS transistor and a second NMOS transistor;

a control electrode of the first PMOS and a control electrode of the second NMOS transistor are connected together at a first node;

a control electrode of the second PMOS and a control electrode of the first NMOS transistor are connected together at a second node;

connecting means for connecting the first node to a first potential source; and inverting means connected between the first node and the second node to maintain them in opposite states.

5. A memory as in claim 4 further comprising fusing means connected between the first node and the first potential source for setting the state of the first node.

6. A memory as in claim 1 wherein:

each of the plurality of switch means is connected to a conducting line at a corresponding node;

a fuse is disposed between each corresponding node; and wherein when a single fuse is blown all switches on one side of the blown fuse connect to a first portion of the input/output nodes, and all switches on the other side of the blown fuse connect to a second portion of the input/output nodes to thereby eliminate any connection to a defective column located between the first and second portions.

7. A memory as in claim 1 wherein:

each of the columns of memory cells includes a pair of lines;

each of the input/output node means comprises a pair of input/output nodes, one coupled to each of the pair of lines;

each of the input/output line means comprises a pair of input/output lines; and each connection node means comprises a pair of connection nodes, one coupled to each of the pair of input/output lines.

8. A memory as in claim 7 wherein:

each of the first and second pair of switches is connected to a conducting line at a corresponding node;

a fuse is disposed between each corresponding node; and wherein when a single fuse is blown all switches on one side of the blown fuse connect to a first portion of the input/output nodes, and all switches on the other side of the blown fuse connect to a second portion of the input/output nodes to thereby eliminate any connection to a defective column located between the first and second portions.

9. A semiconductor memory comprising:

a set of columns of memory cells, each column having a corresponding input/output node coupled to the column;

a set of input/output lines fewer than the set of columns, each input/output line means having corresponding connection node;

a set of switches of the same number as the input/output lines, each switch being connected to a corresponding connection node of an input/output lines, and being selectively connectible to one of at least two of the input/output nodes of adjoining columns of memory cells, and wherein each switch includes a first pair of complementary field effect transistors connected together to connect or disconnect a selected input/output line from the input/output node of a first adjoining column of memory cells; and a second pair of complementary field effect transistors connected together to connect or disconnect the selected input/output line from the input/output node of a second adjoining column of memory cells.

* * * * *